(12) United States Patent
Ghaly (10) Patent No.: US 9,734,919 B2
(45) Date of Patent: Aug. 15, 2017

(54) RECOVERY OF INTERFACIAL DEFECTS IN MEMORY CELLS

(71) Applicant: Seagate Technology LLC, Cupertino, CA (US)

(72) Inventor: Mai A. Ghaly, Bloomington, MN (US)

(73) Assignee: SEAGATE TECHNOLOGY LLC, Cupertino, CA (US)

(*) Notice: Subject to any disclaimer, the term of this patent is extended or adjusted under 35 U.S.C. 154(b) by 511 days.

(21) Appl. No.: 13/900,723

(22) Filed: May 23, 2013

(65) Prior Publication Data
US 2014/0347936 A1    Nov. 27, 2014

(51) Int. Cl.
| | | |
|---|---|---|
| G11C 29/00 | (2006.01) | |
| G11C 29/04 | (2006.01) | |
| G11C 16/16 | (2006.01) | |
| G11C 29/42 | (2006.01) | |
| G11C 29/50 | (2006.01) | |
| G11C 11/56 | (2006.01) | |
| G11C 16/34 | (2006.01) | |
| G11C 16/10 | (2006.01) | |
| G11C 13/00 | (2006.01) | |

(52) U.S. Cl.
CPC .............. G11C 29/04 (2013.01); G11C 11/56 (2013.01); G11C 16/10 (2013.01); G11C 16/16 (2013.01); G11C 16/349 (2013.01); G11C 16/3495 (2013.01); G11C 29/42 (2013.01); G11C 29/50 (2013.01); *G11C 13/00* (2013.01); *G11C 2029/5002* (2013.01)

(58) Field of Classification Search
CPC ....... G11C 16/06; G11C 16/349; G11C 29/00; G11C 29/4401; G11C 13/0035; G11C 13/0033
See application file for complete search history.

(56) References Cited

U.S. PATENT DOCUMENTS

| | | | |
|---|---|---|---|
| 8,193,573 B2 | 6/2012 | Bronner et al. | |
| 8,344,475 B2 | 1/2013 | Shaeffer et al. | |
| 2005/0270842 A1* | 12/2005 | Furuta | G11C 11/5628 365/185.09 |
| 2010/0025811 A1* | 2/2010 | Bronner | H01L 21/67103 257/528 |
| 2010/0306583 A1* | 12/2010 | Kim | G11C 29/82 714/6.13 |
| 2011/0289349 A1* | 11/2011 | Loeser | G06F 11/10 714/6.24 |
| 2013/0194874 A1* | 8/2013 | Mu | G11C 16/06 365/185.18 |
| 2013/0205076 A1* | 8/2013 | Schuette | G06F 12/0246 711/103 |

* cited by examiner

*Primary Examiner* — Douglas King
(74) *Attorney, Agent, or Firm* — Hollingsworth Davis, LLC (57) ABSTRACT

A group of non-volatile, solid state memory cells are transferred from an active list that includes memory cells accessible to a host to a temporary list that includes memory cells temporarily inaccessible to the host. The memory cells included in the temporary list are maintained at a temperature that is substantially the same as or lower than that of memory cells included in the active list. The memory cells are transferred from the temporary list to the active list in response to satisfaction of a trigger condition.

20 Claims, 6 Drawing Sheets

RECOVERY OF INTERFACIAL DEFECTS IN MEMORY CELLS

SUMMARY

Various embodiments describe in this disclosure are generally directed to methods and controllers for extending the useful life of memory cells of a solid-state, non-volatile memory.

Some embodiments involve a method of operating a memory device. A group of non-volatile, solid state memory cells are transferred from an active list that includes memory cells accessible to a host to a temporary list that includes memory cells temporarily inaccessible to the host. The memory cells included in the temporary list are maintained at a temperature that is substantially the same as or lower than that of memory cells included in the active list. While the group of memory cells is included in the temporary list, a trigger condition indicative of a decrease in bit error rate of the group of memory cells is checked. The group of memory cells is transferred from the temporary list to the active list in response to satisfaction of the trigger condition.

Some embodiments are directed to a memory controller. The memory controller maintains an active list that includes memory cells accessible to a host and a temporary list that includes memory cells temporarily inaccessible to the host. The memory cells included in the temporary list maintained at a temperature that is substantially the same as or lower than that of the memory cells included in the active list. A self-anneal processor is configured to transfer a group of memory cells from the active list to the temporary list and check for satisfaction of a trigger condition indicative of a decrease in bit error rate of the group of memory cells while the group of memory cells is included in the temporary list. In response to satisfaction of the trigger condition, the controller transfers the group of memory cells from the temporary list to the active list.

DETAILED DESCRIPTION

Non-volatile memory devices are capable of retaining stored data for relatively long periods of time on the order of years, even to the absence of external power. Non-volatile, solid-state memory includes flash memory that programs data into memory cells by applying a voltage causing a charge to be stored on a floating gate of a transistor. The data can be read later from the memory cell by sensing the voltage of the transistor and comparing the sensed voltage to a read reference voltage (also referred to as a threshold voltage). Flash memory technologies include NOR flash, NAND flash, 2D NAND flash, 3D NAND flash (also called NAND (VNAND)), and various other technologies known to the industry.

Memory cells are known to exhibit errors caused, for example, by charge leakage, manufacturing defects, and disturb effects. These errors may be manifested as bit errors in the decoded data. A memory device may use a number of measures to account for these errors, such as error correction codes (ECC) that utilize extra data for detecting and correcting bit errors. The memory device may generate a bit error rate (BER) signal based on ECC activity and can use BER to analyze system performance.

Non-volatile memory devices may include single level cells (SLCs) that store one bit of data per cell or may include multi-level cells (MLCs) that can be programmed to store two or more bits of information. Reading data stored in SLCs involves distinguishing between two possible voltage levels. Reading data stored in MLCs involves distinguishing between more than two possible voltage levels. In general, a memory cell may be programmed to a predetermined number of threshold voltage ($V_T$) values.

Memory cells can be arranged in dies, blocks, and pages. A die comprises a semiconductor "chip" upon which memory cells are fabricated. The memory cells of a memory device can also be grouped into data units referred to herein as blocks that have a virtual presence and rarely a physical presence. A block can correspond, for example, to a block of memory cells that are read at substantially the same time. A block can also correspond to a block of memory pages that are erased at substantially the same time may be referred to as a block or erasure unit. A block is the smallest addressable unit or block of memory cells for erase operations, typically consisting of multiple pages. Memory cells are programmed in units of pages and the pages are not re-programmed, once programmed, until after the block of pages is erased. Garbage collection operations can be performed on the blocks of pages, wherein the blocks are erased after active data stored in each block is moved to another location. Thus, each memory cell of the memory device undergoes numerous program/erase (PE) cycles during the lifetime of the memory cell. In floating gate transistor memory cells, each PE cycle can degrade the cell, and after many PE cycles, lead to a decreased ability of the cell to retain data without substantial charge leakage.

The useful life of memory cells in the devices above is generally shorter than the lives of the devices themselves. As a result, the devices have more memory than is needed at any one time to permit the controller in the device to retire memory cells into a list also known as a G-list that is permanently inaccessible by the host that is in communication with the memory device. The retired memory cells are typically replaced with previously unused memory cells from the excess supply. The amount of excess memory is selected to be sufficient to achieve a specified life of the memory device.

Some errors experienced by memory cells are caused by progressive degeneration or damage that occurs with increased use. This use causes formation of interfacial charge traps and oxides at the floating gate, eventually leading to wear-out of non-volatile, solid-state memory cells in the devices mentioned above.

Embodiments described herein provide approaches for extending the useful life of non-volatile, solid state groups of memory cells. The approaches discussed herein involve taking memory cells out of operation for periods of time to allow defects to reduce without supplying additional heat to these memory cells beyond the normal (operating or non-operating) temperatures of the memory device. The charge traps anneal out of the memory devices with temperature and time. As a first order approximation, the annealing rate could be described by the following Arrhenius equation:

$$\Delta N_{int}/N_{int} * t = -k*\Delta, \qquad [1]$$

where $N_{int}$ is the interface charge trap density, t is time and k is a function of temperature expressed as:

$$k = k_0 e^{(-E_\alpha/K_B T)}, \qquad [2]$$

where $E_\alpha = 0.52$ EV (the activation energy of H in the Si:H bond) and $K_B$ is the Boltzmann constant.

As reflected in Equation [1], factors that influence the mitigation of interfacial defects involve temperature and time. Temperature influences the mitigation of interfacial defects in the first degree due to the exponential dependency shown above. Time (duration) comes in the second order due to the quasi linear relationship indicated by the Arrhenius equation.

The approaches discussed are referred to herein as "self-annealing" because they require annealing time without addition of heat in excess of the heat generated by the memory device in operation. Self-annealing does not rely on additional means of heating the memory cell. Additionally, self-annealing can facilitate treatment of relatively small groups of memory cells. The self-annealing process can be implemented by existing memory devices because the process may be implemented in software. According to approaches described herein, the bit error rate (BER) of a group of memory cells, such as a block, can be significantly reduced through annealing at temperatures at or below operating temperatures of the active memory cells. Self-annealing can provide memory devices with a longer life expectancy when compared to the life expectancy of similar memory devices that do not incorporate self-annealing.

Figure 1A:
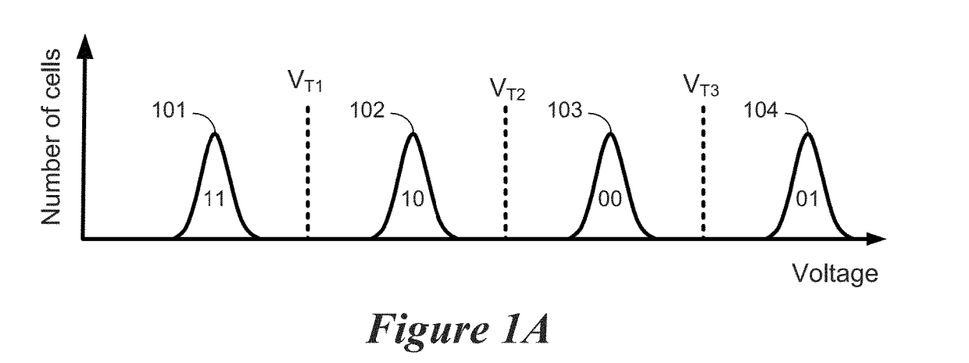
FIGS. 1A-1C illustrate graphically how data is initially stored in a two-bit per cell memory device (A), changes with use (B), and is recovered through self-annealing (C).
Figure 1B:
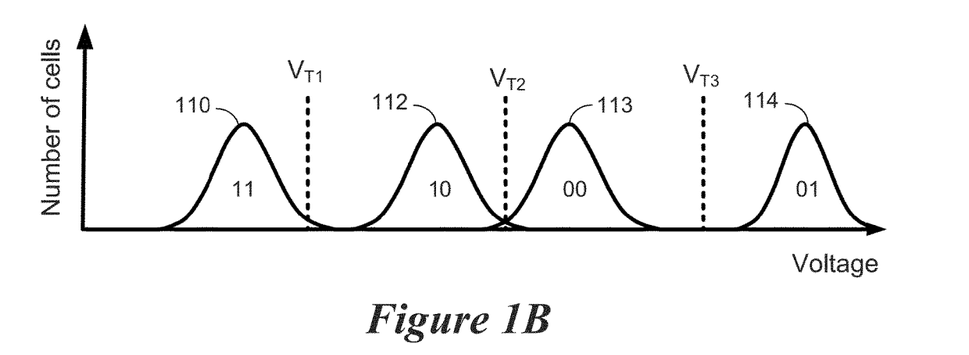
Figure 1C:
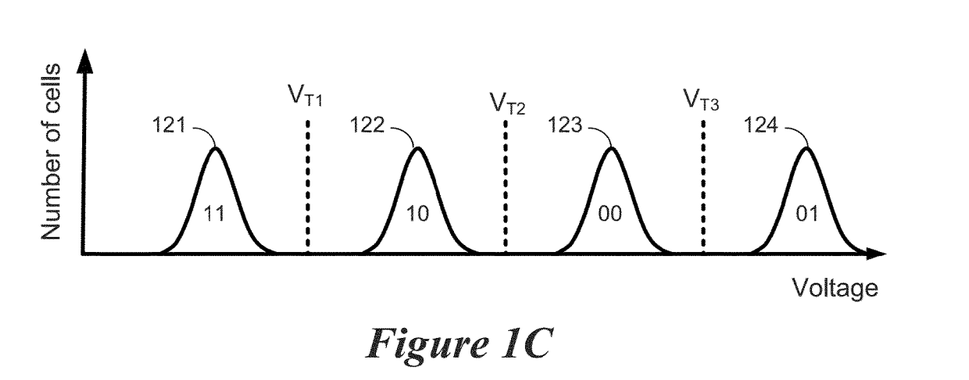

FIGS. 1A-1C illustrate graphically how data is initially stored in a two-bit per cell memory device (FIG. 1A), changes with use (FIG. 1B), and is recovered through self-annealing (FIG. 1C). An example of how data is stored in a two-bit MLC device is shown in FIG. 1A. The digital states/symbols 11, 10, 00, and 01 associated with read voltage distributions 101-104, respectively. Voltages $V_{T1}$, $V_{T2}$, and $V_{T3}$ are threshold voltages that serve as boundaries between each of states/symbols. When new, the two-bit memory device typically has all data for a specific state/symbol for a block or page of memory cells at theoretically at the same read voltage or, in practice, within a narrow spread of read voltages shown as by distributions 101, 102, 103, 104. Thus, after programming, a value of 00 in a cell, all cells in a specified block (or other group of memory) with values of 00 should exhibit a read voltage that falls some-where in narrow distribution 103 that is substantially distant from the boundary threshold voltages $V_{T2}$, and $V_{T3}$.

It should be noted that in an arrangement such as shown in FIG. 1A, the two bits in each cell need not be associated with the same word or page. For example, a memory system may be arranged so that the left most bit (most significant bit or MSB) is associated with one word or page and the right most bit (least significant bit or LSB) is associated with another word or page.

FIG. 1B shows the distributions of the voltages of the cells of FIG. 1A after a large number of PE cycles have occurred. The PE cycle degrade the cells, resulting in an increased number of bit errors due at least in part to the formation of interfacial charge traps and oxides that form at the floating gate as discussed above. Degradation from PE cycle wear out results in increased BER associated with each state/symbol in a group of memory cells. The degradation may cause the central values of the cell voltage distributions 110, 112, 113, 114 of the used cells (cells that have experienced a number of PE cycles) to differ shift slightly from the central values of the distributions 101, 102, 103, 104 when the cells were new. Additionally or alternatively, the cell voltage distributions 110, 112, 113, 114 of the used cells may spread out as they age, eventually overlapping the distributions of neighboring states/symbols and encroaching on the threshold voltage boundaries $V_{T1}$, $V_{T2}$, $V_{T3}$, $V_{T4}$. As shown in FIG. 1B, some of the distributions for a group in a two-bit device may spread beyond the threshold voltage boundaries while others may not. As the central voltages of the distributions shift and/or the distributions widen, the group of memory cells can no longer reliably store data, is no longer useful, and the memory cell group, e.g., block or page, is transferred to the G-list which is inaccessible to the host. The G-list is a list of memory cell addresses that may be maintained by the memory controller. The G-list includes addresses of memory cells (e.g., memory cell pages or blocks) that have been removed from operation and are permanently inaccessible to the host. Transferring memory cells to the G-list is achieved by removing the addresses of the memory cells from the list of active cells and/or adding the addresses of the memory cells to the G-list (inactive list).

FIG. 1C shows the distribution of the number of cells of FIG. 1B after the cells were exposed to the self-annealing process as described in embodiments herein. As seen in FIGS. 1A-1C, all of the distributions 121-124 are substantially narrower and the distributions 121-124 no longer extend near and/or past one of their respective boundary threshold voltages $V_{T1}$, $V_{T2}$, $V_{T3}$.

Figure 2:
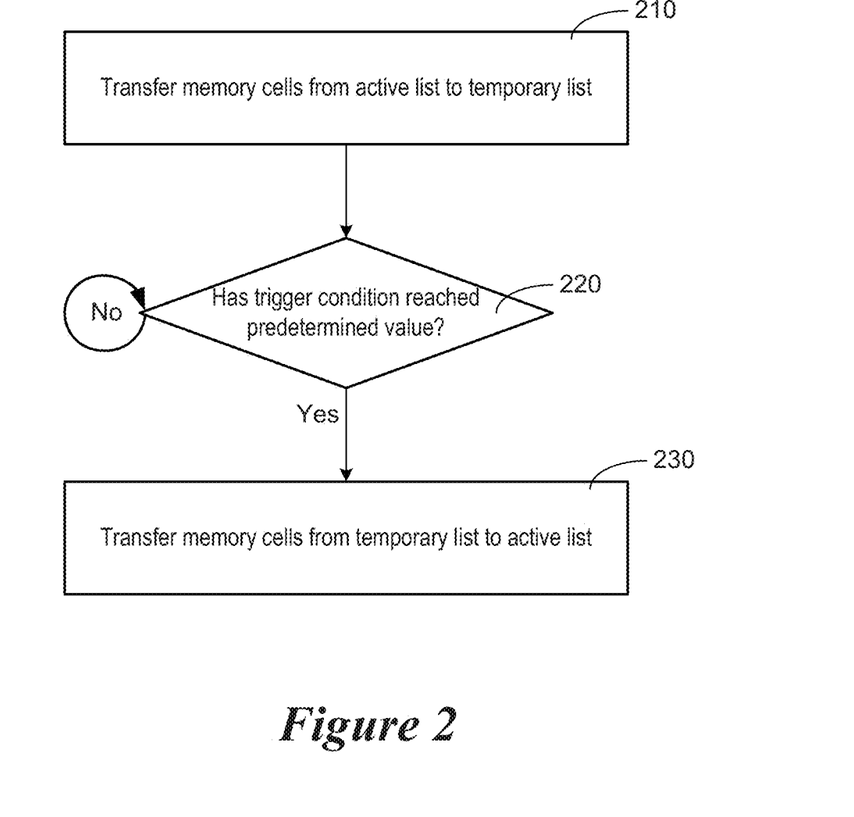
FIG. 2 is a simplified flow diagram of the self-annealing method of extending the useful life of a group of memory cell at temperatures used to operate a memory device.

Embodiments described in this disclosure involve methods and memory controllers that use self-annealing to extend the life of groups of memory cells. A process for operating a memory device in accordance with embodiments described herein is illustrated in FIG. 2. The approaches discussed herein involve transferring a group of non-volatile, solid state memory cells between an active list that includes memory cells accessible to a host and a temporary list that includes memory cells temporarily inaccessible to the host. Memory cells are transferred 210 from the active list to the temporary list as shown in FIG. 2. In some implementations, the transfer of memory cells is performed in response to a life parameter of the memory cells reaching a threshold value. The life parameter is a parameter associated with the age of the memory cells. For example, the life parameter may be the number of PE cycles experienced by the memory cells or the BER or the memory cells. In some cases, two or more life parameters may be used in combination to initiate the transfer of memory cells from the active list to the temporary list. The active list and the temporary list are lists of memory cell addresses that are maintained, for example by software, in registers of the memory controller. Transfer of memory cells from one list to another list as referred to herein may involve implementing software instructions that move the addresses of the memory cells from one list to another list, e.g., by adding the addresses of the memory cells to one list and/or removing the addresses of the memory cells from another list.

The memory cells included in the temporary list are inactive, meaning that they are not accessible by the host for reading or writing data, and experience the operating temperature of the memory device for a period of time. The memory cells included in the temporary list experience a temperature that is substantially the same as (or in some circumstances even lower than) the memory cells included in the active list. "Substantially the same temperature" means that no additional external heat is applied to the cells in the temporary list beyond the heat created by the operation of the memory device.

The process includes checking 220 a trigger condition indicative of or associated with a decrease in bit error rate (BER) of the memory cells in the temporary list toward a target BER. In various embodiments, the trigger condition may comprise time in the temporary list, elapsed time in the temporary list as a function of measured temperature (e.g., according to the Arrhenius equation referred to above), or a measured increase in BER of the memory cells in the temporary list. In implementations wherein time and temperature are factors in the trigger condition, the elapsed time required for self-anneal may be calculated according to the Arrhenius equation using a measured temperature of the memory device, or the measured temperature of the group of memory cells, or other measured temperature. In embodiments wherein measurement of temperature is not possible or is not used, an estimated temperature can be used to determine the time needed for the self-anneal. The estimated temperature can be a temperature value that was measured at an earlier time, e.g., before the group of memory cells was transferred to the temporary list or may be based on data from other possibly similar memory devices, or may be based on a calculation that takes into account one or more of actual or assumed ambient temperature, configuration of the memory device and workload of the memory device, for example.

In response to the trigger condition reaching a predetermined value, the memory cells are transferred from the temporary list to the active. In some implementations, more than one trigger condition may be checked. For example, if the memory cells have been in the temporary list for a predetermined period of time, the BER of the cells may be measured to confirm that the cells have improved and are ready for transfer to the active list. The trigger condition that initiates transfer of the memory cells back to the active list may depend on one or more parameters of the memory cells. For example, a group of memory cells that has experienced more PE cycles may be kept in the temporary list for a longer period of time as compared to a group of memory cells that has experienced fewer PE cycles which may be kept in the temporary list for a shorter period of time. As another example, a group of memory cells that has a higher BER when transferred into the temporary list may be kept in the temporary list for a longer period of time as compared to a group of memory cells that has a lower BER when transferred into the temporary list.

The temporary list is a software created list of addresses of groups of memory cells that are inaccessible by a host. Unlike with heat-induced annealing, self-annealing does not use any means of artificially heating the cells in a temporary list. Indeed, the self-annealing process cannot apply excessive heat without adversely affecting the physically neighboring memory cells in the active list that are accessible by a host and may lose data if exposed to excessive temperatures associated with heat-induced annealing. During the self-annealing process, the groups of memory cells, being adjacent to groups of cells in the active list, are thus exposed to similar temperatures. When the memory device is operating, the cells in the active list and the temporary list are at the operating temperature of the device. The operating temperature may vary between different types and configurations of devices and may vary due to the work load of the device and/or ambient temperature. For example, in some implementations, the operating temperature of the memory device is generally on the order of between about 35° C. and about 80° C. When the device is not operating, the temperature of the memory device is generally somewhat less than its operating temperature depending on factors such as the ambient temperature, the length of time the device is inactive and how proximate the device is to other devices that are operating or in standby modes. As described herein, self-annealing involves relying on the operating temperature of the device to provide the annealing temperature without using additional means (such as additional heat sources) to increase the temperature of memory cells in the temporary list.

Figure 3:
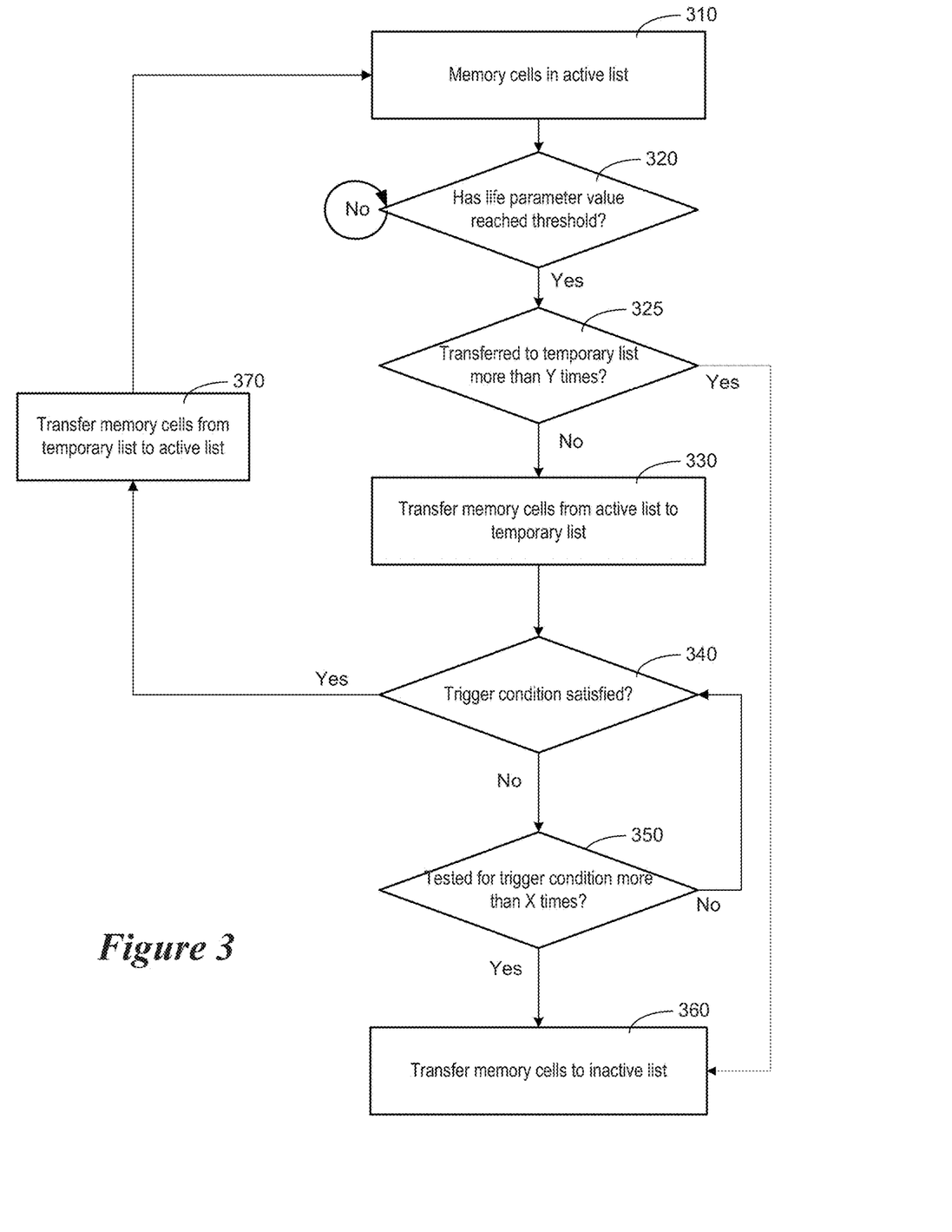
FIG. 3 is a detailed flow diagram of one embodiment of the method of extending the life of memory cells in a solid-state, non-volatile memory device.

FIG. 3 is a flow diagram that illustrates a self-anneal process for memory cells that can be implemented by a memory controller. Initially, the memory cells are maintained 310 in an active list and are accessible to the host. With use, the memory cells undergo garbage collection and experience a number of PE cycles that age the cells. A life parameter of the cells indicates the aging of the cells. The memory controller checks 320 to see if a life parameter of a block of memory cells has reached a threshold value. If the life parameter reaches the threshold value, the group of memory cells may be transferred 330 to the temporary list.

Blocks that have been transferred into and out of the temporary list many times may have a diminished ability to recover. In some implementations, the process checks 325 to see if the block of memory cells has been transferred into the temporary list more than a predetermined number of times. If so, the block of memory cells is moved 360 to an inactive list that includes memory cells that are permanently inaccessible by the host, e.g., the G-list.

Because memory cells are erased in blocks, PE cycles pertain to blocks of cells. Thus, cell blocks may be a convenient grouping of cells for the purpose of the self-anneal processes discussed herein. In some embodiments, the life parameter that initiates the transfer of memory cells from the active list to the temporary list is the BER of the block of memory cells. The threshold value of the BER may be, for example, on the order of about 0.001 or more. In some embodiments the life parameter is the average number of errors per page of the memory cells in the block. The threshold value may be, for example, on the order of about 8 for a 1 KB page size device. In some embodiments, the life parameter is a number of PE cycles experienced by the block of memory cells. The threshold value of the number of PE cycles may be a fraction of the maximum memory life such as 50% or more.

In some embodiments, the life parameter is an elapsed running time and may be, for example, on the order of several months or more. In some embodiments, multiple life parameters may be used together to initiate transfer to the temporary list, such as a both use and time. For example, the memory cells may be transferred from the active list to the temporary list after about 75% of its max PE cycles or more and several months or more of operation. In some embodiments, the life parameters used to initiate the transfer are an elapsed running time at a temperature and may be, for example, on the order of several months or more at an average temperature of about 65° C. or more time at a lower average temperature.

The threshold value of the life parameter may also be some fraction of the estimated end of life value such as, for example, 75%, 50%, or 25% of the estimated end of life value. Using a value that is a smaller fraction of the end of life value would increase the number of self-annealing cycles a group of cells experiences before the group of cells is retired to the G-list that is permanently inaccessible by the host. In some cases, this may advantageously affect the overall life of the block of memory cells.

After transfer 330 to the temporary list, the group of memory cells remains in the temporary list for a period of time during which self-annealing occurs. In some embodiments, the memory controller maintains the group of memory cells in the temporary list until a triggering condition occurs 340. The triggering condition indicates a decrease in bit error rate of the group of memory cells, e.g., a decrease toward a target bit error rate value. The occurrence of the triggering condition indicates the group of memory cells in the temporary list has regained at least some of its useful life by a reduction in the average BER of the group of memory cells in the temporary list. In some cases, the triggering condition may involve a different type of parameter than the life parameter that is used to initiate transfer of the group of cells into the temporary list. In some cases, the triggering condition may involve a different value of the same life parameter used to initiate transfer of the group of cells into the temporary list. For example, consider the scenario where BER is used as the life parameter and the trigger condition is a predetermined BER value. In this scenario, a group of memory cells is moved from the active list to the temporary list in response to the BER being greater than a threshold BER value. The group of memory cells remains in the temporary list until the BER drops to BER value lower than the threshold BER value. The reduction of the BER to the lower value while the cells are in the temporary list is a trigger condition that initiates a transfer of the memory cells from the temporary list back to the active list.

In some implementations, the life parameter is different from the parameter involved in the trigger condition. For example, number of PE cycles may be the life parameter that initiates transfer of a group of cells to the temporary list, while measured BER below a predetermined value is a triggering condition that initiates transfer of the group of cells from the temporary list back to the active list. Triggering conditions include a BER value or a percentage of the BER when the group of memory cells was moved into the temporary list. Other possible triggering conditions include a predetermined elapsed time in the temporary list, a predetermined elapsed time in the temporary list as a function of measured or estimated temperature, average number of errors per page, and/or a percentage of the average number of errors per page of the memory cells when they were initially transferred into the temporary list, among other conditions. The triggering condition indicates a reduction of BER of the memory cells when compared to the BER of the memory cells at the time that the memory cells were transferred into the temporary list. In some embodiments, the triggering condition may be a specific predetermined value of some parameter indicative of a BER that is less than the BER of the group of cells when the group of cells was initially transferred to the temporary list. In some embodiments, the triggering condition may be a relative value such as a percentage or fraction e.g., 75%, 50%, 25%, or some other fraction, of a parameter value that existed at the time that the memory cells were transferred from the active list to the temporary list, or may be a percentage or fraction of an expected end of life value of the block of memory cells. In response to the triggering condition being satisfied, the memory controller causes the block of memory cells in the temporary list to be transferred 370 from the temporary list to the active list.

In some implementations, the triggering condition may be a function of the number of times that the block of memory cells has been transferred to the temporary list. For example, a block that has only been in the temporary list a few times may have a greater capacity to recover and/or may be able to recover in less time than a block that has been in the temporary list many times. Thus, a different triggering condition (higher BER or longer time in the temporary list) may be used for the block that has been in the temporary list more times as compared to the triggering condition used for a block that has been in the temporary list fewer times.

In some implementations, the memory cells in the temporary list are periodically scanned to measure the BER of the memory cell groups. The reduction of the BER of a particular block of memory cells to a predetermined value is a trigger condition that initiates a transfer of that memory cell block back to the active list. Scanning the memory cells blocks in the temporary list may be implemented as part of a background media scan, a process that reads blocks of memory cells and determines the BER of the memory cell blocks as an operation that occurs in the background of normal memory storage operations.

In some implementations, a known reference pattern may be stored in the block of memory cells after the memory cells are moved into the temporary list. The data stored in the cells in the temporary list is not useful to the host since the cells in the temporary list are inaccessible to the host. Thus, storing a known reference pattern in memory cells in the temporary list can facilitate determination of the BER of these cells. In implementations where a reference pattern is stored in the cells in the temporary list, checking the trigger condition may include reading the memory cells having the known reference pattern stored therein, comparing the data read from the cells to the known reference pattern, and determining the BER of the cells based on the comparison of the data read from the cells to the known reference pattern. If the BER decreases below a predetermined value or percentage, then the triggering condition is satisfied and the cells are returned to the active list.

In some implementations, a known reference pattern is not used and the data stored in the memory cells at the time the block of memory cells is moved to the temporary list is not changed. The memory cells are read, e.g., during background media scans, and the data read from the memory cells is decoded. During the decoding process, errors in the data are identified and the BER of the memory cells is determined.

The process may also include monitoring 350 the number of times that the trigger condition has been checked for a block of memory cells. If the trigger condition is not met after a predetermined number of checks this may indicate that the memory cells cannot recover. The block of memory cells may be moved 360 from the temporary list to the inactive list.

One embodiment tests a block of memory cells in the temporary list for satisfaction of the trigger condition every three days and determines that the block of memory cells should be transferred to the inactive list after unsuccessfully testing for satisfaction of the trigger condition four times. Test frequencies and/or number of unsuccessful tests before transferring the block of memory cells to the inactive list may vary. Some implementations are designed to avoid maintaining blocks of memory cells in a temporary list when the blocks have little chance of being reconditioned sufficiently to be significantly useful in an active list. A significantly useful group of recovered memory cells is one that is able to remain in the active list for a predetermined minimum amount of time.

In some implementations, there is a connection between memory usage and the conditions under which the memory cells are moved into and out of the temporary list. For example, if a host is requiring a lot of memory usage, then the memory cells may be left in the active list longer and/or the time that the memory cells are left in the temporary list may be decreased. On the other hand, if the host is requiring less memory, the memory controller may take advantage of that situation and move more memory cells into the temporary list to let them recover while the need for memory is low.

Figure 4A:
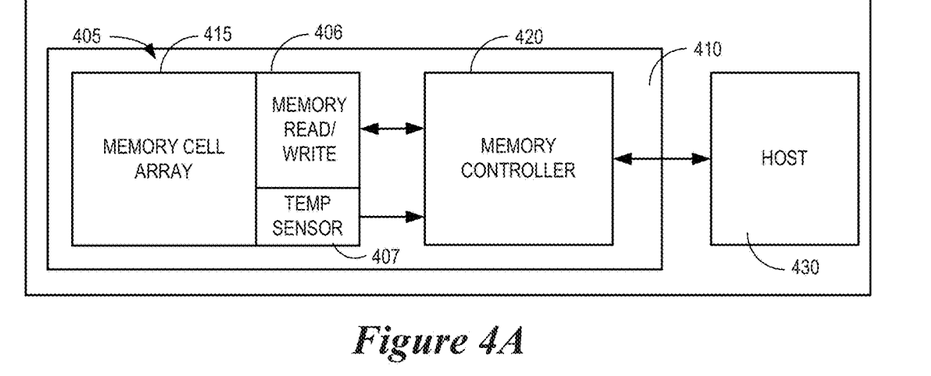
FIG. 4A is a block diagram of a system capable of storing data in memory cells and later retrieving the data stored including self-annealing groups of memory cells at a temperature similar to that of active memory cells.
Figure 4B:
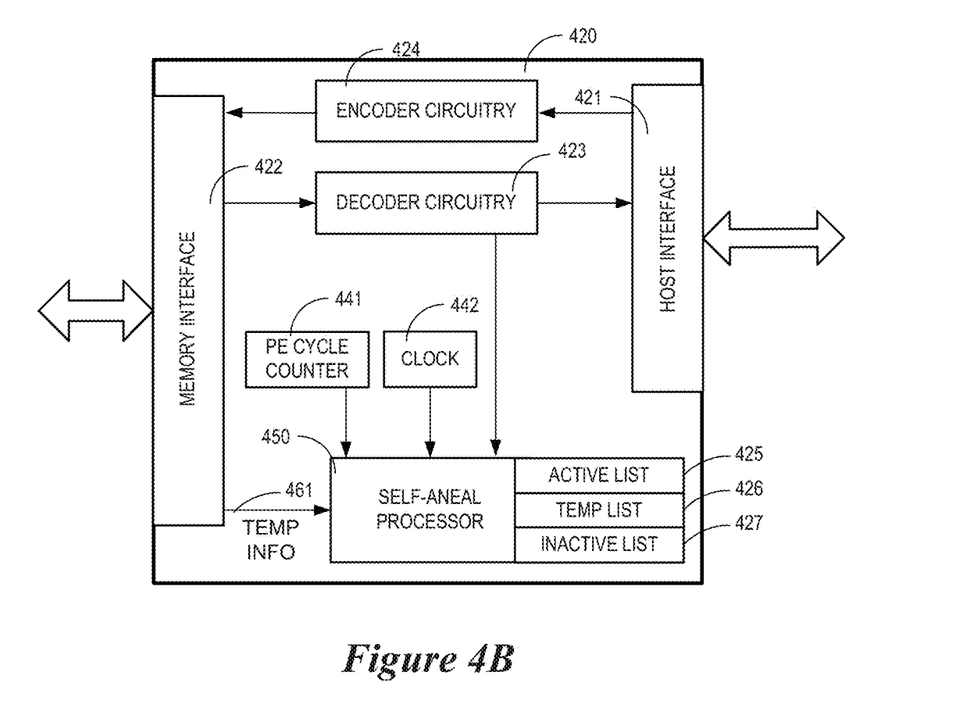
FIG. 4B provides a more detailed view of the memory controller of FIG. 4A including a self-anneal processor for passing data among active lists, temporary lists, and inactive lists of groups of memory cells in accordance with embodiments discussed herein.
Figure 4C:
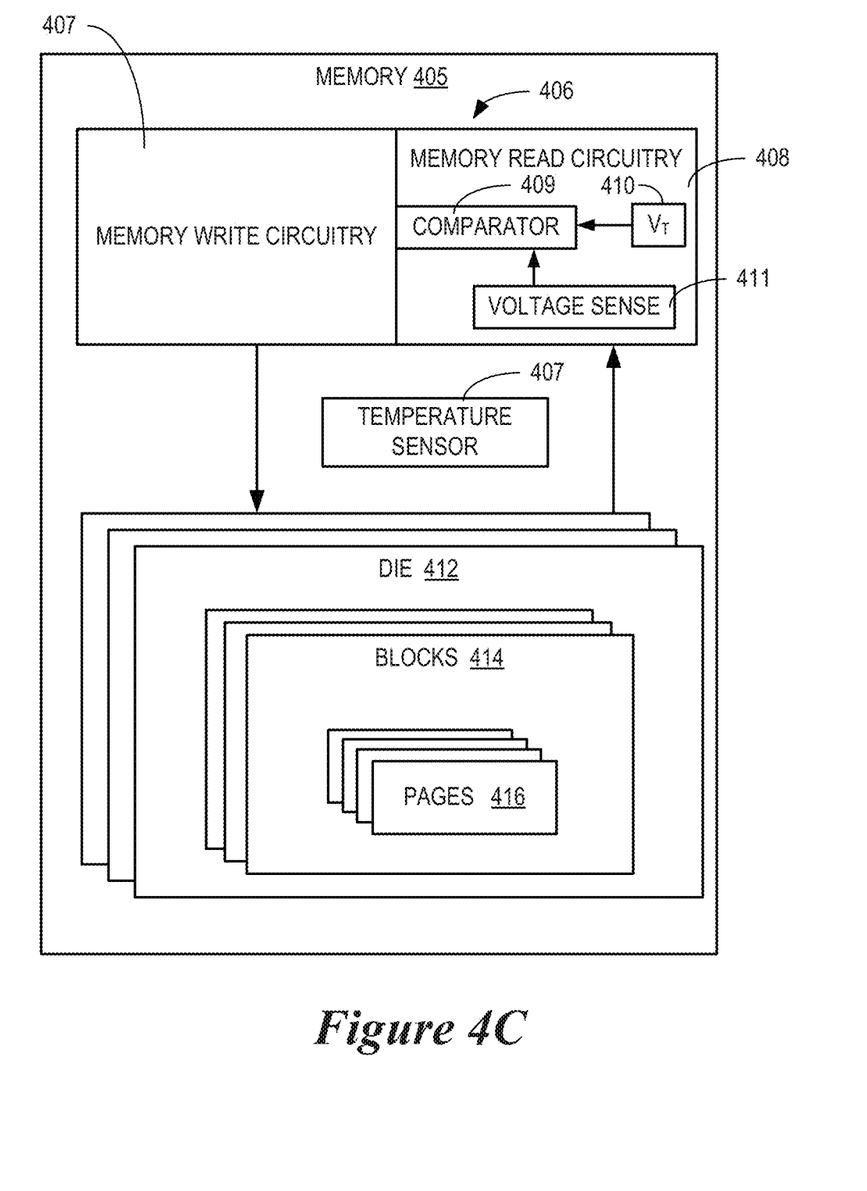
FIG. 4C provides a more detailed view of the memory cell array function of FIG. 4A including memory reading circuitry for obtaining data used to determine bit error rates of groups of memory cells.

The processes described herein and/or illustrated by the flow diagrams of FIGS. 2 and 3 may be implemented in hardware, software and/or firmware by the systems and devices illustrated in FIGS. 4A-4C.

FIG. 4A is a block diagram of an embodiment of a memory system 400 capable of storing data in memory cells and later retrieving the data stored. The memory system 400 is capable of implementing processes that provide for self-annealing of groups of memory cells at a temperature similar to or less than that of active memory cells. The system 400 includes a memory device 410 capable of being coupled for communication with a host processor 430. The memory device 410 comprises a memory 405 and a memory controller 420 that is in communication with the host 430. The memory comprises an array of memory cells 415 and read/write circuitry 406. The read/write circuitry 406 is configured to generate signals that cause data received from the memory controller 420 to be stored into the memory cells. The read/write circuitry 406 includes circuitry configured to read the voltage of the memory cells in the memory cell array. In some implementations, the memory cell array 415 also comprises a temperature sensor 407 for measuring temperature of the memory cell array 415 and/or monitoring the temperature history of the memory cell array 415. The measured temperature and/or temperature history may be used satisfy a trigger condition. For example, the triggering condition may be satisfied if the block of memory cells has remained in the temporary list for an elapsed time that is a function of the measured temperature or temperature history.

The block diagram of FIG. 4A and other block diagrams discussed herein show system components divided into functional blocks. It will be appreciated by those skilled in the art that there exist many possible configurations in which these functional blocks can be arranged and implemented. The examples depicted herein provide some possible functional arrangements for system components. Alternatively, some implementations may encompass all or a portion of the functionality of the memory controller 420 included within the host 430. Other implementations may encompass the read/write element 406 included with the functions of the controller 420. In still another example, the various approaches described herein may be implemented using hardware, software, or a combination of hardware and software. Memory chips, controller chips and/or host computers may contain one or more of the functional elements discussed herein.

FIG. 4B provides a more detailed view of the memory controller 420 of the embodiment shown in FIG. 4A. Memory controller 420 includes a self-anneal processor 450 configured to maintain one or more lists, e.g., active list 425, temporary list 426, and inactive list 427. The lists 425, 426, 427 identify groups of memory cells in accordance with embodiments discussed herein. The active list 425 identifies memory cells that are accessible by the host. The temporary list 426 identifies memory cells that are in a self-anneal mode and are temporarily inaccessible by the host. The inactive list 427 identifies memory cells that have been removed from operation and are permanently inaccessible to the host. In addition to the lists 425-427, the self-anneal processor 450 may maintain additional information about the groups of memory cells in the lists, e.g., elapsed time in the list, BER upon transfer into the list, etc. The self-anneal processor 450 is configured to transfer groups of memory cells between the lists 425-427 as previously described.

The memory controller 420 further comprises a host interface 421, a memory interface 422, encoder circuitry 424, and decoder circuitry 423. The memory interface 421 serves to permit the memory controller 420 to communicate with the memory 405. The host interface 421 serves to permit communication between the host 430 and the memory controller 420. The host interface 421 passes data that is to be written into storage to the encoder circuitry 426 which operates to encode the data using an error correcting code (ECC). When a memory write command is implemented, encoded data is transferred through the memory interface 422 to the memory read/write element 406. The memory read write element 406 generates signals that cause the encoded data to be stored in the memory array 415.

When a read command is implemented, the memory read/write circuitry senses the analog voltages present in the memory cells and converts the sensed analog voltages to digital values by comparing the analog voltages to one or more threshold voltage references. The digital data is transferred from the memory 405 to the controller 420 via the memory interface 422. The digital data is decoded by the decoder circuitry 423 and the decoded data is transferred to the host through the host interface 421. The decoder circuitry 423 uses the ECC to identify errors in the data and can determine the BER of the memory cells based on the identified errors.

The self-anneal processor 450 may use the BER determined by the decoder 423 as a threshold value that causes the self-anneal processor 450 to move a memory cell block from the active list 425 into the temporary list 426 and/or may use the BER (or any other quality metric) determined by the decoder 423 as a trigger condition that causes the self-anneal processor 450 to move a memory cell block from the temporary list 426 back to the active list 425.

As illustrated in FIG. 4B, the memory controller 420 includes a PE cycle counter 441 configured to count the number of PE cycles experienced by blocks of memory cells. The memory controller may also include a clock 442 or timer configured to keep track of the elapsed time for each of a number of memory cell blocks in the temporary list. The self-anneal processor 450 may use information from the PE cycle counter 441, the clock 442 and/or temperature information 461 from the temperature sensor 407 to move blocks of memory cells between the lists 425-427.

FIG. 4C provides a more detailed view of the memory 405 of FIG. 4A. In the illustrated embodiment, the memory 405 includes memory cell array 415 having memory cells arranged in pages 416, blocks 414, and die 112. As previously discussed, the memory 405 includes memory read/write circuitry 406 arranged to read data from and write data to the memory cell array 415. The memory read/write circuitry 406 includes memory write circuitry 407 and memory read circuitry 408. The memory read circuitry 408 includes voltage sense circuitry 411 configured to sense the analog voltages stored on the memory cells. A comparator 409 is configured to compare the sensed analog voltages to one or more threshold voltages 410 and to convert the sense analog voltages to digital symbols based on the comparison. As previously discussed, in some implementations, the memory 405 includes a temperature sensor 407 that provides temperature information to the self-anneal processor 450. The temperature sensor 407 may comprise multiple sensor elements configured to sense the temperature at various locations of the memory 405. The temperature information provided to the self-anneal processor 450 may include, for example, the temperature or temperature history of memory cells included in the temporary list.

Embodiments discussed herein are further illustrated by the following example. The following test methods were used to evaluate the endurance of the groups of memory cells and characterize the BER of groups of memory cells over various PE cycles.

Devices in examples 1-3 were tested using JEDEC Standard JESD218A Solid State Drive (SSD) Requirements and Endurance Test Method February 2011 revision. This standard defines JEDEC requirements for solid state drives. Conditions and test procedures are described to determine stress and endurance of non-volatile memory in an SSD. For each defined class of SSD, the standard defines the conditions of use and the corresponding endurance verification requirements together with testing procedures. Endurance for the enterprise application class is determined with a stress at actual use (power on) conditions of 55° C. running at 24 hours per day followed by a relaxation at power off conditions of 40° C. for 3 months. Accelerated relaxation conditions of 125° C. for 22 minutes simulate 40° C. for 3 months.

EXAMPLE

Figure 5:
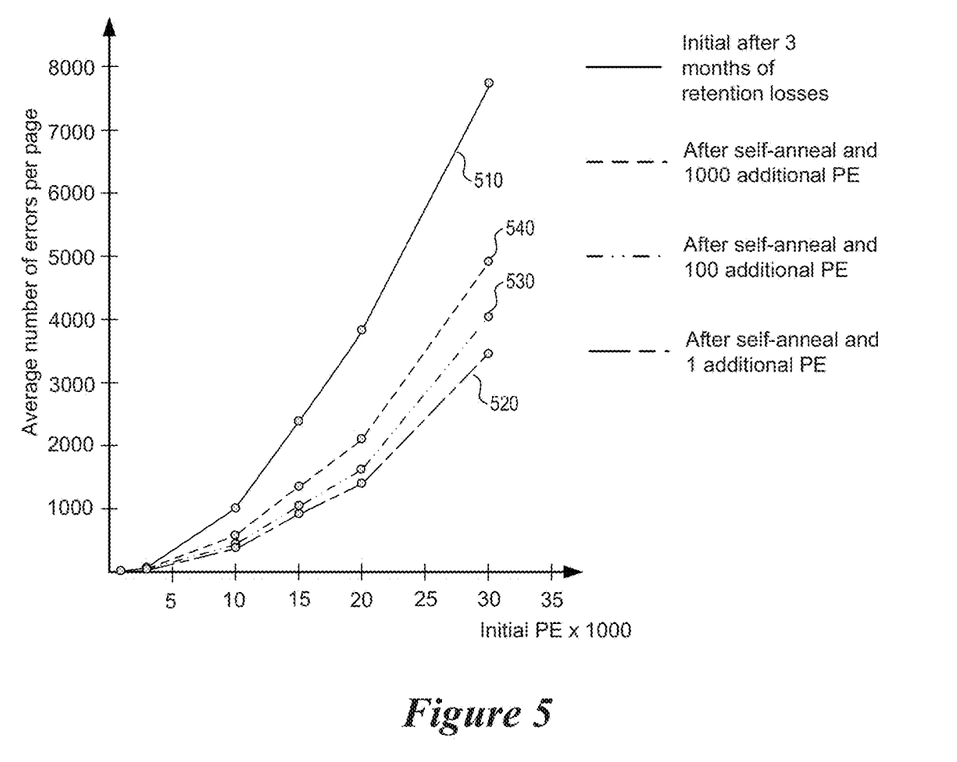
FIG. 5 is a graph that shows the experimental results of room temperature self-annealing of groups of memory cells on their number of errors after having gone through increasing levels of program and erase cycles under different conditions before and after self-annealing.

Sixteen solid state drives were tested for endurance according JESD218A. Each of the sixteen device samples included 2048 pages with 16 kilobytes per page and were initially subjected to PE cycle increments of 1000, 3000, 10,000, 15,000, 20,000, and 30,000, respectively. Each sample SSD was then was subjected to an accelerated relaxation time for an enterprise application class equivalent to 40° C. for 3 months. The SSD samples were tested for average numbers of errors per page as shown by curve 510 of FIG. 5.

The stressed, relaxed, and tested SSDs for each measured PE cycle increment were self-annealed by being set aside for one week at room temperature. Then each SSD was subjected to one additional PE cycle and was retested after the one additional PE cycle for average number of errors per page. The results are plotted on FIG. 5 as curve 520 and show approximately a little over 50% reduction in errors reflecting a little over 50% recovery of usefulness of the blocks of memory cells tested. It is expected that the recovery through self-annealing would take on the order of 2.1 days or less if the self-annealing were at the operating temperature of the SSD instead of at room temperature.

The SSDs were then subjected to an additional 99 PE cycles, which increased the total number of PE cycles experienced by the drives to 1100, 3100, 10100, 20100, and 30100, respectively. The SSD for each measured PE cycle increment (1100, 3100, 10100, 20100, and 30100) was tested for the average number of errors per page. The results are plotted on FIG. 5 as curve 530. As shown, the SSDs exhibit approximately a little under 50% reduction in errors reflecting a little under 50% recovery of usefulness of the blocks of memory cells tested.

The PE cycles for the SSDs was increased to 2000, 4000, 11000, 21000, and 31000, respectively. Then the SSD for each measured PE cycle increment was retested for the average number of errors per page. The results were plotted on FIG. 5 as curve 540. As shown, the SSDs show approximately a 40% reduction in errors reflecting about a 40% recovery of usefulness of the blocks of memory cells tested. The annealed SSDs withstood an additional 3000 PE without reaching their number of average errors per page before self-annealing took place. This finding by itself represents an added 10% improvement in the flash life without any added cost.

The foregoing description of the example embodiments have been presented for the purposes of illustration and description. It is not intended to be exhaustive or to limit the inventive concepts to the precise form disclosed. Many modifications and variations are possible in light of the above teachings. Any or all features of the disclosed embodiments can be applied individually or in any combination, and are not meant to be limiting but purely illustrative. It is intended that the scope be limited by the claims appended herein.

What is claimed is:
1. A method of operating a memory device, comprising:
transferring a group of non-volatile, solid state memory cells from an active list that includes memory cells accessible to a host to a temporary list that includes memory cells temporarily inaccessible to the host, memory cells included in the temporary list maintained at a temperature that is substantially the same as or lower than that of memory cells included in the active list;
determining an elapsed time interval during which the group of memory cells has been included in the temporary list;
determining a number of times that the group of memory cells has been included in the temporary list;
determining if the number of times that that the group of memory cells has been included in the temporary list is less than a predetermined threshold;
if it is determined that the number of times that the group of memory cells has been included in the temporary list is less than the predetermined threshold, checking a first trigger condition indicative of a decrease in bit error rate of the group of memory cells included in the temporary list, the first trigger condition comprising a determination that the elapsed time interval has reached a predetermined time interval value, the predetermined time interval value based on a number of program/erase cycles of the group of memory cells;
if it is determined that the number of times that the group of memory cells has been included in the temporary list is greater to or equal to the predetermined threshold, checking a second trigger condition, the second trigger condition different than the first trigger condition;

transferring the group of memory cells from the temporary list to the active list in response to the time interval reaching the predetermined time interval value if number of times that the group of memory cells has been included in the temporary list is less than the predetermined threshold; and transferring the group of memory cells from the temporary list to the active list in response to the second trigger condition being reached if it is determined that the number of times that the group of memory cells has been included in the temporary list is greater than or equal to the predetermined threshold.

2. The method of claim 1, wherein transferring the group of memory cells from the active list to the temporary list comprises transferring the group of memory cells in response to a life parameter of the group of memory cells reaching a threshold value.

3. The method of claim 1, wherein the predetermined time interval value is longer for memory cells having experienced relatively more program erase cycles and is shorter for memory cells having experienced relatively fewer program erase cycles.

4. The method of claim 2, wherein:
transferring the group of memory cells from the active list to the temporary list in response to a life parameter of the group of memory cells reaching a threshold value comprises transferring the group of memory cells from the active list to the temporary list in response to a bit error rate of the group of memory cells reaching a threshold bit error rate value;

checking the at least one of the first trigger condition and the second trigger condition comprises determining a quality metric of the group of memory cells in the temporary list; and transferring the group of memory cells from the temporary list to the active list in response to satisfaction of the at least one of the first trigger condition and the second trigger condition further comprises transferring the group of memory cells from the temporary list to the active list in response to the quality metric reaching a predetermined value.

5. The method of claim 4, wherein:
determining the quality metric comprises determining the bit error rate of the group of memory cells in the temporary list; and transferring the group of memory cells from the temporary list to the active list in response to satisfaction of at least one of the first trigger condition and the second trigger condition further comprises transferring the group of memory cells from the temporary list to the active list in response to the bit error rate reaching a predetermined bit error rate value that is less than the threshold bit error rate value.

6. The method of claim 1, wherein:
checking at least one of the first trigger condition and the second trigger condition comprises:
measuring a temperature of the memory device while the group of memory cells is included in the temporary list; and transferring the group of memory cells from the temporary list to the active list in response to satisfaction of at least one of the first trigger condition and the second trigger condition further comprises transferring the group of memory cells from the temporary list to the active list in response to the elapsed time reaching the predetermined elapsed time as a function of the measured temperature.

7. The method of claim 1, wherein:
checking at least one of the first trigger condition and the second trigger condition comprises scanning the group of memory cells included in the temporary list to determine a bit error rate; and further comprising:
counting a number of scans to determine the bit error rate; and transferring the group of memory cells to an inactive list of memory cells that are permanently inaccessible by the host device in response to the number of scans exceeding a termination value.

8. The method of claim 7, wherein scanning the group of memory cells to determine the bit error rate of the group of memory cells is performed as part of a background media scan performed on the memory device.

9. The method of claim 1, further comprising:
counting a number of times that the group of memory cells has been transferred from the active list to the temporary list; and transferring the group of memory cells to an inactive list that includes memory cells permanently inaccessible by the host device when the number of times has exceeded a predetermined number.

10. The method of claim 1, further comprising:
storing a known reference pattern in the group of memory cells;

wherein checking at least one of the first trigger condition and the second trigger condition comprises reading the group of memory cells while they are included in the temporary list and using the known reference pattern to determine a bit error rate of the group of memory cells.

11. The method of claim 1, wherein transferring the group of memory cells from an active list to a temporary list comprises transferring the group of memory cells in response to a life parameter reaching a threshold value, wherein the threshold value is a function of the number of times the group of memory cells has been transferred from the active list to the temporary list.

12. A memory controller, comprising:
an active list that includes memory cells accessible to a host;

a temporary list that includes memory cells temporarily inaccessible to the host the memory cells included in the temporary list maintained at a temperature that is substantially the same as or lower than that of the memory cells included in the active list; and a self-anneal processor configured to:
transfer a group of memory cells from the active list to the temporary list, determine an elapsed time interval during which the group of memory cells has been included in the temporary list, determine a number of times that the group of memory cells has been included in the temporary list, determine if the number of times that that the group of memory cells has been included in the temporary list is less than a predetermined threshold, if it is determined that the number of times that the group of memory cells has been included in the temporary list is less than the predetermined threshold, check for satisfaction of a first trigger condition indicative of a decrease in bit error rate of the group of memory cells while the group of memory cells is included in the temporary list, the first trigger condition comprising a determination that the elapsed time interval has reached a predetermined time interval value, the predetermined time interval value based on a number of program/erase cycles of the group of memory cells, if it is determined that the number of times that the group of memory cells has been included in the temporary list is greater to or equal to the predetermined threshold, check a second trigger condition, the second trigger condition different than the first trigger condition;

transfer the group of memory cells from the temporary list to the active list in response to the time interval reaching the predetermined time interval value if number of times that the group of memory cells has been included in the temporary list is less than the predetermined threshold; and transfer the group of memory cells from the temporary list to the active list in response to the second trigger condition being reached if it is determined that the number of times that the group of memory cells has been included in the temporary list is greater than or equal to the predetermined threshold.

13. The memory controller of claim 12, wherein the self-anneal processor is configured to transfer the group of memory cells from the active list to the temporary list in response to a life parameter of the group of memory cells reaching a threshold value.

14. The memory controller of claim 13, wherein:
the life parameter comprises one or both of bit error rate of the group of memory cells and number of PE cycles experienced by the group of memory cells.

15. The memory controller of claim 12, wherein:
the life parameter comprises one or both of bit error rate of the group of memory cells and number of PE cycles experienced by the group of memory cells; and
at least one of the first trigger condition and the second trigger condition comprises the elapsed time as a function of measured temperature.

16. The memory controller of claim 12, wherein:
the life parameter comprises one or both of bit error rate of the group of memory cells and number of PE cycles experienced by the group of memory cells; and
at least one of the first trigger condition and the second trigger condition-comprises the bit error rate of the group of memory cells.

17. The memory controller of claim 12, wherein at least one of the first trigger condition and the second trigger condition is satisfied if a bit error rate of the group of memory cells included in the temporary list is less than a predetermined bit error rate, wherein the predetermined bit error rate is a percentage of an initial bit error rate of the group of memory cells at the time the group of memory cells was transferred from the active list to the temporary list.

18. The memory controller of claim 12, wherein the self-anneal processor is configured to count a number of scans performed on the group of memory cells in the temporary list to determine bit error rate and to transfer the group of memory cells from the temporary list to an inactive list of memory cells that are permanently inaccessible by the host device in response to the number of scans exceeding a termination value.

19. The memory controller of claim 12, wherein the self-anneal processor is configured to count a number of times that the group of memory cells has been transferred from the active list to the temporary list and to transfer the group of memory cells to an inactive list of memory cells permanently inaccessible by the host device when the number of times exceeds a predetermined number.

20. The memory controller of claim 12, wherein the self-anneal processor is configured to cause a known reference pattern to be stored in the group of memory cells when the memory cells are transferred to the temporary list.

* * * * *